United States Patent

Watarai

[19]

[11] Patent Number: 6,078,206
[45] Date of Patent: Jun. 20, 2000

[54] SMALL AMPLITUDE SIGNAL OUTPUT CIRCUIT

[75] Inventor: Seiichi Watarai, Tokyo, Japan

[73] Assignee: NEC Corporation, Tokyo, Japan

[21] Appl. No.: 09/098,525

[22] Filed: Jun. 17, 1998

[30] Foreign Application Priority Data

Jun. 17, 1997 [JP] Japan ..................... 9-160087

[51] Int. Cl.[7] .............. H03K 3/353; G05F 3/02
[52] U.S. Cl. ............ 327/320; 327/112; 327/541; 327/546; 326/33; 326/84; 323/313
[58] Field of Search ................ 327/108, 333, 327/541, 543, 544, 546, 112, 318, 319, 320, 542; 326/80, 81, 83, 84, 86, 31, 32, 33, 34; 323/313, 314

[56] References Cited

U.S. PATENT DOCUMENTS

| 4,471,242 | 9/1984 | Noufer et al. ................ 327/541 |
| 4,791,321 | 12/1988 | Tanaka et al. ................ 326/27 |
| 4,833,350 | 5/1989 | Frisch ........................ 326/64 |
| 5,373,199 | 12/1994 | Shichinohe et al. ........... 327/309 |
| 5,467,044 | 11/1995 | Ashe et al. ................. 327/333 |
| 5,545,977 | 8/1996 | Yamada et al. ............... 323/313 |

OTHER PUBLICATIONS

Patent Abstracts of Japan, vol. 15, No. 428 (E–1130), JP 03 184419 (Nov. 8, 1991).
Patent Abstracts of Japan, vol. 011, No. 081 (E–488), JP 61 234622 (Mar. 12, 1987).
Patent Abstracts of Japan, vol. 011, No. 122 (E–500), JP 61–269530 (Apr. 16, 1987).
Patent Abstracts of Japan, vol. 018, No. 010 (E–1487), JP 05 252020 (Jan. 10, 1994).

*Primary Examiner*—Toan Tran
*Assistant Examiner*—Terry L. Englund
*Attorney, Agent, or Firm*—Foley & Lardner

[57] ABSTRACT

A small amplitude signal output circuit comprises an output section, for receiving a logic signal to output a small amplitude signal, having first and second transistors connected in series between a first source line and a second source line, and voltage control sections connected between each of the source lines and the output section for reducing the output voltage supplied from the output node, thereby allowing ON-resistance of the transistors of the output section to be smaller. The small ON-resistance of the transistors in turn allows variations in the output voltage of the output circuit caused by variations in the fabrication process to be smaller. The voltage control sections may have a function for reducing variations in the output circuit due to temperature variation.

4 Claims, 8 Drawing Sheets

SMALL AMPLITUDE SIGNAL OUTPUT CIRCUIT

BACKGROUND OF THE INVENTION (a) Field of the Invention

The present invention relates to a small amplitude signal output circuit and, more particularly, to a small amplitude signal output circuit transmitting logic signals between integrated circuits by way of a transmission line.

(b) Description of the Related Art

Some output circuits are used as signal transmission means for transmitting signals between two or more integrated circuits via transmission paths such as bus lines. When a logic signal is to be transmitted from an output circuit, the logic signal assumes either H-level or L-level of logical value. Accordingly, there essentially exist, in an output circuit of an integrated circuit, an input terminal for receiving internal logic signals from the internal circuit of the integrated circuit, and an output terminal for delivering the internal logic signals to another integrated circuit.

Although most conventional transmission signals have an amplitude close to the power source potential supplied to the integrated circuit, the signal amplitude has been reduced for transmission in recent years. For instance, in case of a CMOS interface for a conventional transmission signal, the signal amplitude was substantially equal to the power source potential such as about 5V or about 3V. On the other hand, the recent transmission signal having a small amplitude, such as used in a low voltage differential signaling (LVDS) interface, the signal amplitude is as low as about 0.3V. The reason for reduction of the signal amplitude is that the reduction achieves great advantages in higher transmission speed, lower power dissipation, and smaller noise during signal transmission. Accordingly, it is requested that integrated circuits for achieving a higher speed and/or lower power dissipation as the primary objects thereof have an output circuit capable of outputting lower amplitude signals. As a means for outputting the low amplitude signals, some proposals have been offered, and the following is an example thereof.

With reference to FIG. 1 showing a circuit diagram of Pseudo Emitter Coupled Logic interface (PECL interface) as a first conventional output circuit, which is a typical example of a low amplitude interface, the output circuit comprises: a PMOS transistor M11 having a source connected to source line VDD of positive potential, a drain connected to output terminal OUT1 which outputs a low amplitude signal and a gate connected to input terminal IN1; an NMOS transistor M12 having a drain connected to the drain of transistor M11, a gate connected to the gate of transistor M11, and a source connected to source line VSS of ground potential; and a terminal resistor (terminating resistor) RTT1, having a first terminal connected to output terminal OUT1 and a second terminal connected to a terminal (terminating) power source VTT.

In general, positive potential is supplied from outside the integrated circuit to source line VDD, and source line VSS is grounded. In other cases, source line VDD is grounded, and a negative potential is supplied to source line VSS.

In reference to FIG. 1, the values of terminal resistor RTT1 and terminal power source potential VTT are generally specified in a standard wherein the former is about 50 Ω, and the latter is obtained by subtracting about 2V from the power source potential VDD.

In operation, when a potential at H-level which is close to potential VDD of source line VDD is supplied to input terminal IN1, transistor M11 is OFF and transistor M12 is ON. Thus, a current path is formed from terminal power source VTT to source line VSS via terminal resistor RTT1 and transistor M12. L-level potential VOL of output terminal OUT1 at this stage is expressed by:

$$VOL=VTT-\{(VTT-VSS) \times RTT\}/(RTT+RONN) \quad (1),$$

wherein VTT, VSS, RTT and RONN represent potential of terminal power source VTT, potential of source line VSS, resistance of resistor RTT1 and ON-resistance of NMOS transistor M12, respectively.

When potential at L-level which is close to potential VSS of source line VSS is supplied to input terminal IN, transistor M11 is ON and transistor M12 is OFF. Thus, a current path is formed from source line VDD to terminal source VTT via transistor M11 and terminal resistor RTT1. Potential VOH at H-level of output terminal OUT1 at this stage is expressed by:

$$VOH=VTT+\{(VDD-VTT) \times RTT\}/(RTT+RONP) \quad (2),$$

wherein RONP represents ON-resistance of PMOS transistor M11.

To calculate practical values for H-level VOH and L-level VOL of output OUT1 and relative output signal amplitude (VOH−VOL), each variable in expressions, or formulas, (1) and (2) is set as follows: VDD=3V, VSS=0V, VTT=1.5V, RTT=50 Ω, RONN=200 Ω, RONP=200 Ω.

After the above values are substituted for the variables in expressions (1) and (2), H-level VOH and L-level VOL of output OUT are calculated as follows:

$$VOH=1.8V \quad (3)$$

$$VOL=1.2V \quad (4).$$

Thus, the output signal amplitude is calculated as follows:

$$VOH-VOL=0.6V \quad (5)$$

The conventional output circuit has a feature that it enables to obtain a desired small signal amplitude by selecting ON-resistances RONP and RONN, which are adjusted based on the size of the transistor elements in the integrated circuit, depending on the power source potentials VDD, VSS, VTT, and terminal resistor RTT which are specified in advance.

Since the first conventional output circuit has a single output terminal for transmission of a single signal, it is generally called a single phase transmission system.

As another transmission system having a low signal amplitude interface, so-called differential transmission system is also used which outputs a pair of transmission signals from respective output terminals. The pair of transmission signals in the differential transmission system have a feature that the phase of the pair of signals are reversed from each other and have equal potentials of H-level and L-level. The reversed phase scheme in the differential transmission system provides twice the dynamic range compared to the single phase transmission system. In addition, there is an advantage that the influence by noise in the power source potential and interference by electromagnetic induction are reduced. In view of this advantage, the differential transmission system is used for a high-speed and high-reliability transmission. Some proposals have been made for the output circuit delivering differential signals in the differential transmission system, and following is an example thereof.

FIG. 2 shows a second conventional output circuit for LVDS interface as a typical differential transmission system, wherein similar constituent elements are designated by reference symbols similar to those used in FIG. 1. The output circuit comprises: a first output section 11 having transistors M11 and M12, terminal transistor RTT1, input terminal IN1 and output terminal OUT1, which are common to the first conventional output circuit; and a second output section 12 having constituent elements similar to those in the first output section 11. Specifically, the second output section 12 comprises PMOS transistor M21 having a source connected to positive potential source line VDD, a drain connected to output terminal OUT2 and a gate connected to input terminal IN2, NMOS transistor M22 having a drain connected to the drain of transistor M21, a gate connected to the gate of transistor M21, and a source connected to grounded potential source line VSS, terminal resistor RTT2 having a first terminal connected to output OUT2 and a second terminal connected to terminal source VTT.

The values for terminal resistors RTT1 and RTT2, and terminal power supply voltage VTT are generally specified in a standard, wherein RTT1 and RTT2 are set at about 45 to 65 Ω and VTT is set at about 1.1V to 1.4V.

In operation, when H-level potential which is close to potential VDD of source line VDD is supplied to input terminal IN1, and at the same time, L-level potential which is close to potential VSS of source line VSS is supplied to input terminal IN2, transistors M12 and M21 are ON, transistors M11 and M22 are OFF. Thus, a current path is formed from source line VDD to terminal source VTT via transistor M21 and terminal resistor RTT2, and another current path is formed from terminal source VTT to source line VSS via terminal resistor RTT1 and transistor M12. Accordingly, output terminal OUT1 supplies an L-level signal and output terminal OUT2 supplies an H-level signal. H-level signal potential VOH and L-level signal potential VOL are given by the expressions (1) and (2) as mentioned before.

When L-level potential close to potential VSS of source line VSS is supplied to input terminal IN1, and at the same time, H-level potential which is close to potential VDD of source line VDD is supplied to input terminal IN2, transistors M11 and M22 are ON, transistors M12 and M21 are OFF. Thus, a current path is formed from source line VDD to terminal source VTT via transistor M11 and terminal resistor RTT1, and another current path is formed from terminal source VTT to source line VSS via terminal resistor RTT2 and transistor M22. Accordingly, output terminal OUT1 supplies a H-level signal and output terminal OUT2 supplies a L-level signal.

As mentioned above, the technique for generating H-level and L-level for the output signal potential in the second conventional output circuit of the differential output system is similar to the case of the first conventional output circuit of the single phase system. Thus, if the variables in the expressions (1) and (2) are the same for both the circuits, H-level signal VOH and L-level signal VOL are equal to the above-mentioned numerical values (3), (4) and (5). It is possible to obtain desired small amplitude signals in the second conventional output circuit, similarly to the first conventional output circuit, by selecting ON-resistances RONP of PMOS transistors M11 and M21 or RONN of NMOS transistors M12 and M22, which are controlled based on the size of transistor elements in the integrated circuit, depending on the power source potentials VDD, VSS and VTT, and terminal resistors RTT1 and RTT2 specified in advance.

Although both the conventional output circuits have advantages as described above, there is a problem that the variation in the output signal amplitude is considerably large.

In addition, the following three factors cause variations in the ON-resistances RONP and RONN, based on which H-level voltage VOH and L-level voltage VOL of the output signal of the first conventional output circuit are controlled.

The first factor is the influence by variations in the fabrication process of the MOS transistors. The fabrication process involves variation factors which affect shape variations in the transistor elements which constitute the output circuit. For example, variations in ON-resistance of the MOS transistor range generally about ±10% to ±20% depending on the shape of the transistor.

The second factor is the influence by the ambient temperatures at which the electronic device equipped with the integrated circuit is used under various environments. The ON-resistance of the MOS transistor changes, especially with the change of the ambient temperature: for example, the variations generally range about ±8% to ±16% with respect to a temperature rage of 100° C.

The third factor is the influence by the variations in the power source potential. The power source potential supplied from outside the integrated circuit changes due to the potential loss on the source line in addition to the potential change of the external power source itself. The ON-resistance of the MOS transistor changes with the change of the input voltage: for example, the variations generally range about ±10% to ±15% with respect to a power source potential change of ±10%.

Thus, the variations in the ON-resistance of the MOS transistor generally range about ±28% to 51% when taking into account all the three factors mentioned above. The variations caused by the three factors generate variations of H-level VOH, L-level VOL and signal amplitude as follows:

$$VOH = 1.713V \text{ to } 2.007V \quad (6)$$

$$VOL = 0.993V \text{ to } 1.287V \quad (7)$$

$$VOH - VOL = 0.426V \text{ to } 1.014V. \quad (8)$$

The variations in the signal amplitude VOH−VOL are 1.7 times greater than the case in which the signal amplitude is calculated from the ON-resistance of the MOS transistor when the three factors are not taken into account, namely 0.6V, as shown in expressions (3) and (4). Variations in the output signal amplitude, especially in the case of variations in the higher direction, reduce and cancel the advantages of the small amplitude transmission described before.

In summary, the first and the second conventional output circuits have a problem of large variations in the signal amplitude to be solved, which cause reduction in transmission speed, increase in power dissipation and increase in the noise during signal transmission.

SUMMARY OF THE INVENTION

In view of the above, it is an object of the present invention to provide a small amplitude signal output circuit capable of The present invention provides a small amplitude signal output circuit.

The above and other objects, features and advantages of the present invention will be more apparent from the following description, referring to the accompanying drawings.

PREFERRED EMBODIMENTS OF THE INVENTION

Figure 1:
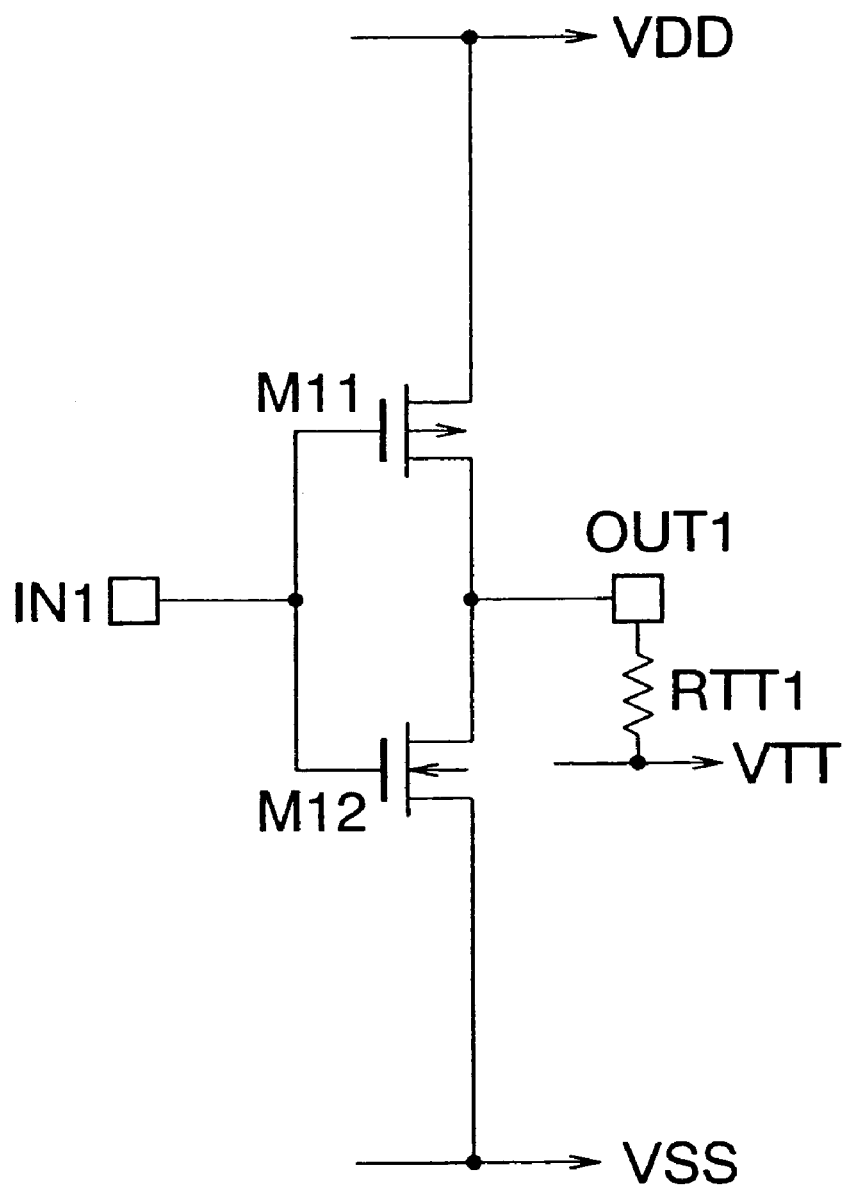
FIG. 1 is a circuit diagram of a first conventional output circuit.
Figure 2:
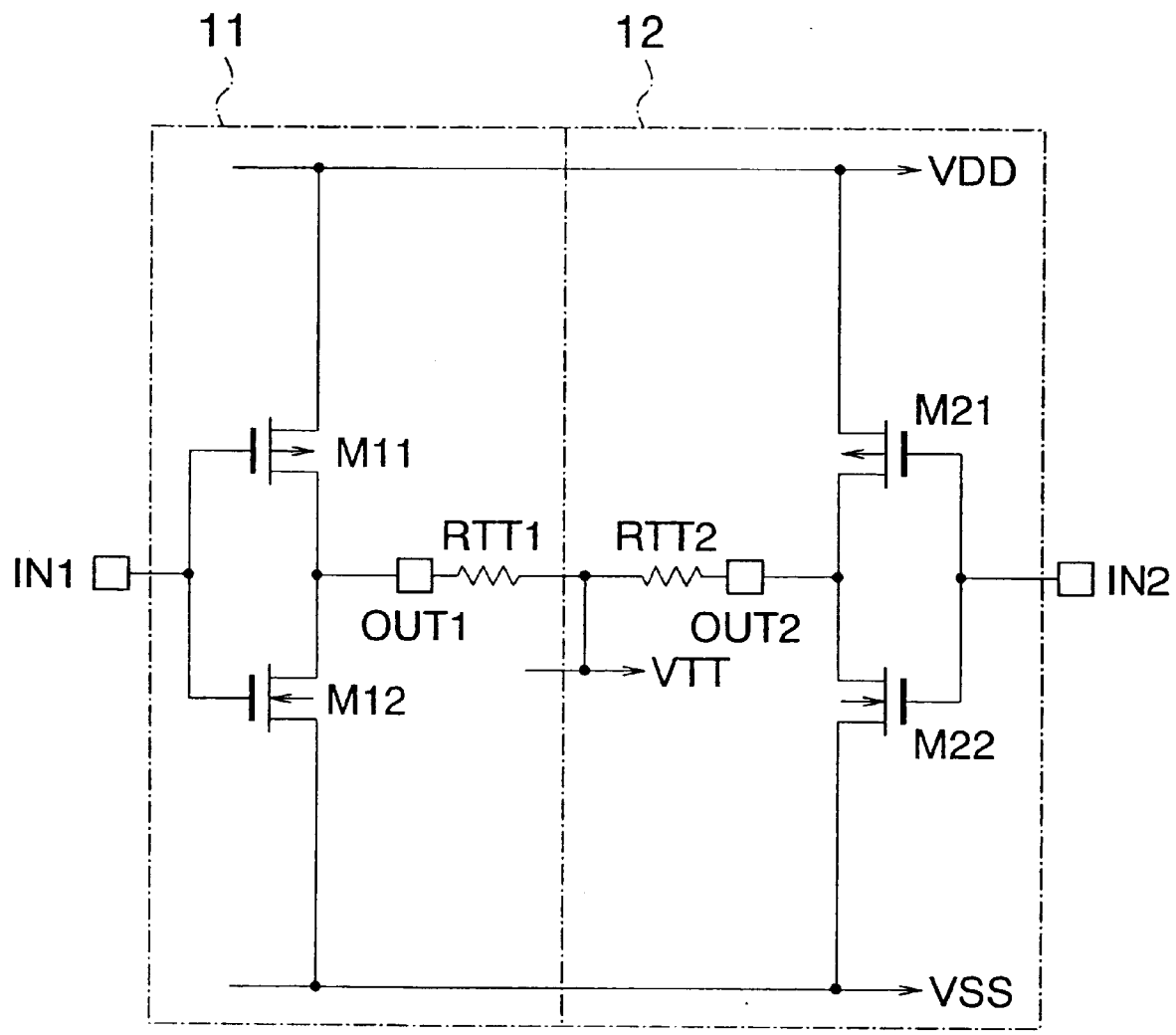
FIG. 2 is a circuit diagram of a second conventional output circuit.

Now, the present invention is more specifically described with reference to accompanying drawings, wherein similar constituent elements are designated by the same or similar reference numerals throughout the drawings.

Figure 3:
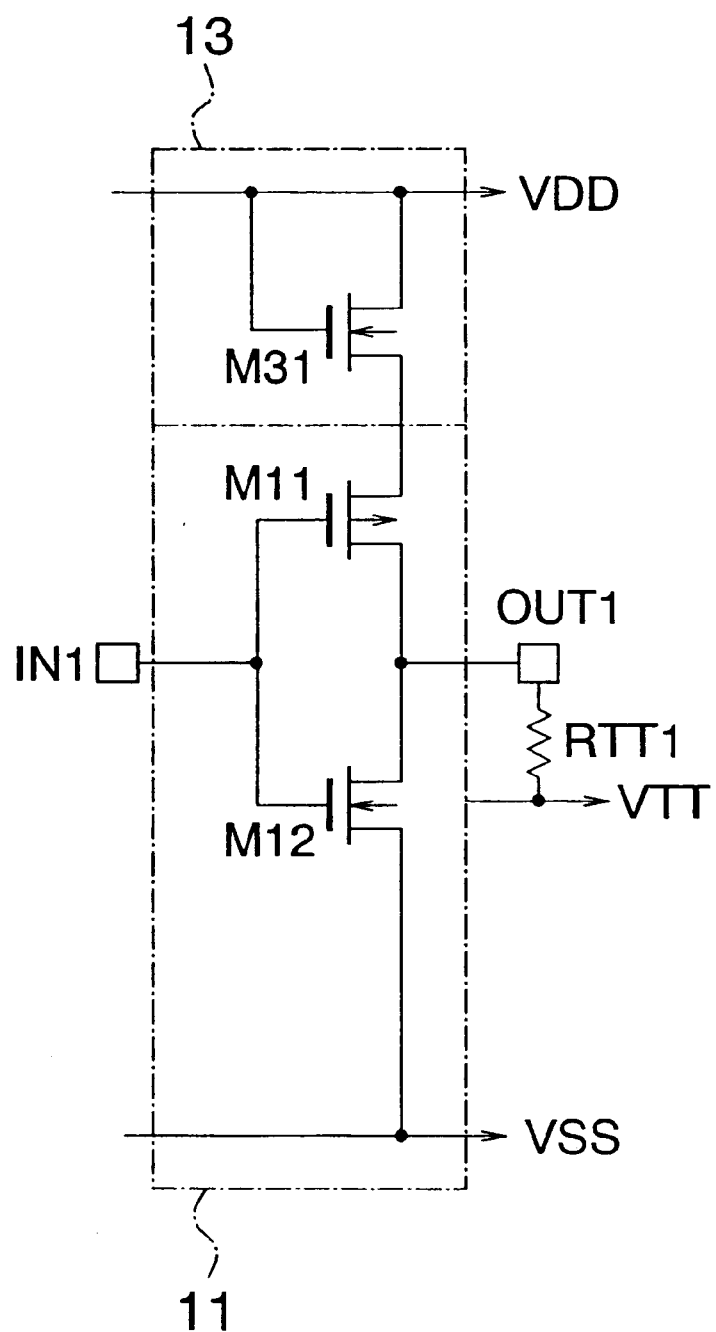
FIG. 3 is a circuit diagram of an output circuit according to a first embodiment of the present invention.

Referring to FIG. 3 showing a circuit diagram of an output circuit according to a first embodiment of the present invention, the output circuit comprises an output section 11 having pMOS transistor M11 and nMOS M12, a terminal resistor RTT1, an input terminal IN1 and an output terminal OUT1, which are similar to those in the first conventional output circuit. In addition, the output circuit comprises a voltage control section 13, connected between a power source line VDD and the source of transistor M11, for controlling the voltage level of transistor M11.

Voltage control section 13 comprises an nMOS transistor M31 having a gate and a drain connected together to power source line VDD and a source connected to the source of the transistor M31 of output circuit 11, thereby forming a diode structure.

In operation, when a signal potential at L-level which is close to the potential of power source voltage VSS is supplied to input terminal IN1 and transistor M11 of output circuit 11 is ON, transistor M12 is OFF, whereas transistor M31 of voltage control section 13 is ON at any time. Thus, a current path is formed from source line VDD via transistor M31, transistor M11 and terminal resistor RTT1 to terminal power source line VTT. H-level voltage VOH of output terminal at this stage is expressed by:

$$VOH=VTT+\{(VDD-VTN31-VTT) \times RTT\}/(RTT+RONP) \qquad (9)$$

wherein VTN31 represents gate-source voltage of NMOS transistor M31. In this configuration, output H-level VOH is reduced by VTN31×RTT/(RTT+RONP). ON-resistance of transistor M31 is neglected therein because it is significantly smaller compared to ON-resistance RONP of transistor M11.

The configuration of the smaller output voltage VOH in the output circuit of the present embodiment enables the configuration of a smaller absolute value of ON-resistance RONP of transistor M11, compared to ON-resistance in the conventional circuit, to thereby suppress the variation of H-level VOH of output signals. ON-resistance of transistor M11 generally varies by the influence of the three factors mentioned before, that is, fabrication process, ambient temperature and/or power source voltage.

As understood from expression (2) defining H-level of the output signal in the first conventional output circuit, the reduction in ON-resistance RONP of transistor M11 raises output H-level VOH, which is suppressed by voltage control section 13 providing a potential difference, as mentioned above and discussed in detail hereinafter.

The output potential of the voltage control section 13, i.e., potential at the source of transistor M11 is obtained by subtracting gate-source voltage VTN31 of transistor M31 from power source voltage VDD. When power source voltage VDD changes, the voltage change appears as it is in the output potential of voltage control section 13.

If each variable in expression (9) is set such that VDD=3V, VSS=0V, VTT=1.5V, RTT=50 Ω, VTN31=1.0V and RONP=33 Ω, H-level VOH of output signal of the present embodiment is calculated as follows:

$$VOH=1.8V \qquad (10)$$

This value is similar to the expression (3) in the conventional technique.

It is assumed that ON-resistance RONP of transistor M11 varies to a larger value by the influence of the three factors, and that H-level VOH of output signal varies within the range of maximum ±51% as recited in connection with the conventional technique. Expressions (9) wherein the variation factors are taken into account provides H-level VOHC of output signal as follows:

$$VOHC=1.750V \text{ to } 1.878V \qquad (11).$$

Thus, H-level VOHC varies −2.8% to +4.8% from a normal voltage of 1.8 volts in the present embodiment, which fact shows a significant improvement from the conventional variation range of −4.8 to +11.5%.

In the above embodiment, even if ON-resistance RONP of transistor M11 varies in a large percentage, variations in the output potential is lower because the absolute variations in ON-resistance of transistor M11 is smaller compared to the conventional circuit, which is obtained by the configuration that the absolute value of ON-resistance of transistor M11 is set at a smaller value depending on the gate-source voltage drop of transistor M31. That is, it is possible to suppress the variation of output H-level VOH.

Figure 4:
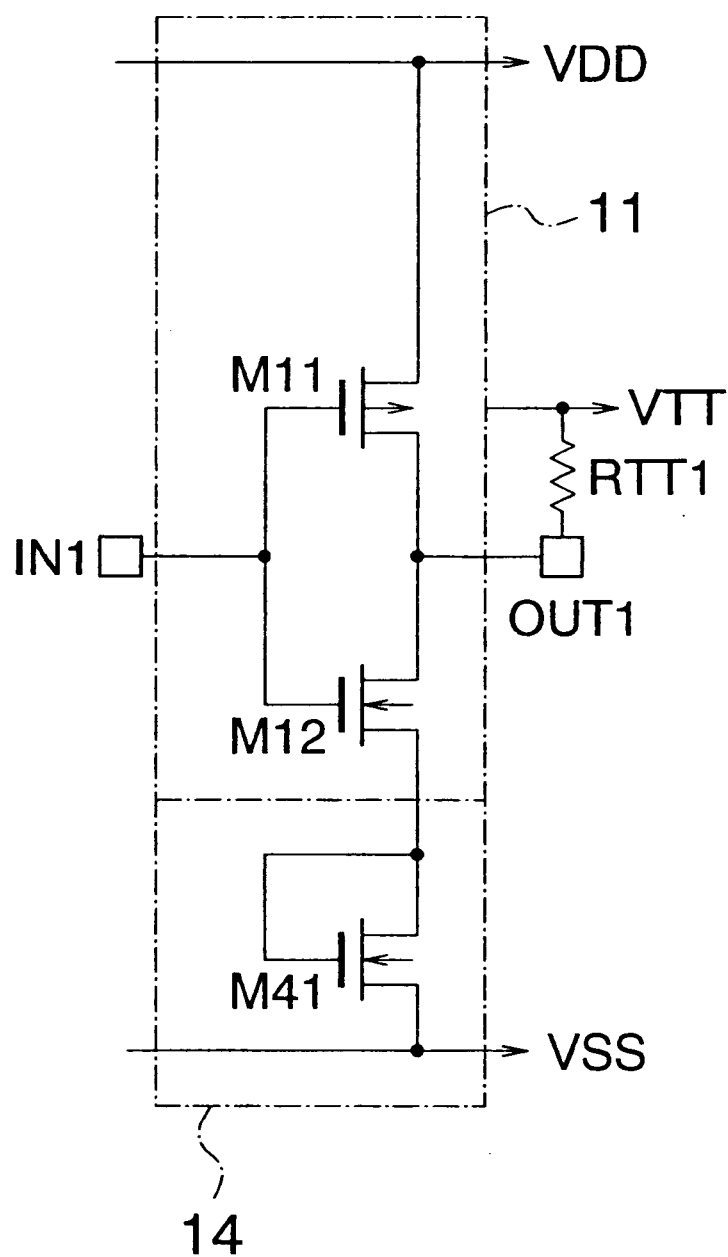
FIG. 4 is a circuit diagram of an output circuit according to a second embodiment of the present invention.

Referring to FIG. 4, an output circuit according to a second embodiment of the present invention is similar to the first embodiment except that voltage control section 14 is connected between power source line VSS and the source of nMOS transistor M12 for controlling the source voltage of transistor M12.

Voltage control section 14 comprises an nMOS transistor M41 having a drain and a gate connected together to the source of transistor M12, and a source connected to power source line VSS, thereby forming a diode structure.

The output circuit functions for suppressing the variation of L-level VOL of output signals. Specifically, similarly to the first embodiment, ON-resistance RONN of transistor M12 of output circuit 11 is selected at a smaller absolute value, which provides a smaller variations in the absolute value of ON-resistance RONP caused by the influence of the three factors, to thereby suppress the variation of H-level VOH of output signals.

In operation, when a signal potential at H-level which is close to the potential of power source voltage VDD is supplied to input terminal IN, transistors M12 and M11 of output circuit 11 are ON and OFF, respectively, whereas transistor M41 of voltage control section 14 is ON at any time. Thus, a current path is formed from terminal power source VTT via terminal resistor RTT1, transistor M12 and transistor M41 to source line VSS. L-level VOL of the output terminal at this stage is expressed by:

$$VOL=VTT+\{(VTT-VTN41-VSS) \times RTT\}/(RTT+RONN) \qquad (12)$$

wherein VTN41 represents gate-source voltage of NMOS transistor M41. ON-resistance of transistor M41 is neglected because it is small.

As understood from expression (1) defining output L-level VOL of the first conventional output circuit, if ON-resistance RONN of transistor M12 varies in a smaller value due to the three factors, output L-level VOL falls. Voltage control section 14 supplies the potential difference to thereby suppress the fall.

Transistor M41 acts as a voltage controller in the present embodiment, and the output potential of voltage control section 14 is obtained by adding gate-source voltage VTN41 of transistor M41 to power source voltage VSS. The output potential of voltage control section 14 shows the amount of variation when power source voltage VSS varies.

When each variable in expression (12) is set such that VDD=3V, VSS=0V, VTT=1.5V, RTT=50 Ω, VTN31=1.0V and RONN=33 Ω, L-level VOL of output signal of the present embodiment is calculated as follows:

$$VOL=1.2V \quad (13)$$

This value is similar to the expression (4) in the conventional technique.

It is assumed that ON-resistance RONN of transistor M12 varies to a larger value by the influence of the three factors, and that L-level VOL of output signal varies within the range of maximum ±51% as recited in connection with the conventional technique. Expressions (12) wherein the variation factors are taken into account provides L-level VOLC of output signal as follows:

$$VOLC=1.222V \text{ to } 1.250V \quad (14).$$

Thus, L-level VOLC varies −6.5% to +4.2% from a normal voltage of 1.2 volts in the present embodiment, which fact shows a significant improvement from the conventional variation range of −17.3% to +7.3%.

In the above embodiment, even if ON-resistance RONP of transistor M12 varies in a large percentage, absolute variation in the output potential is lower because the absolute ON-resistance of transistor M12 is smaller compared to the conventional circuit, which is obtained by the configuration that the absolute value of ON-resistance of transistor M12 can be set at a smaller value based on the gate-source voltage drop of transistor M41. That is, it is possible to suppress the variation of output H-level VOL in the present embodiment.

Figure 5:
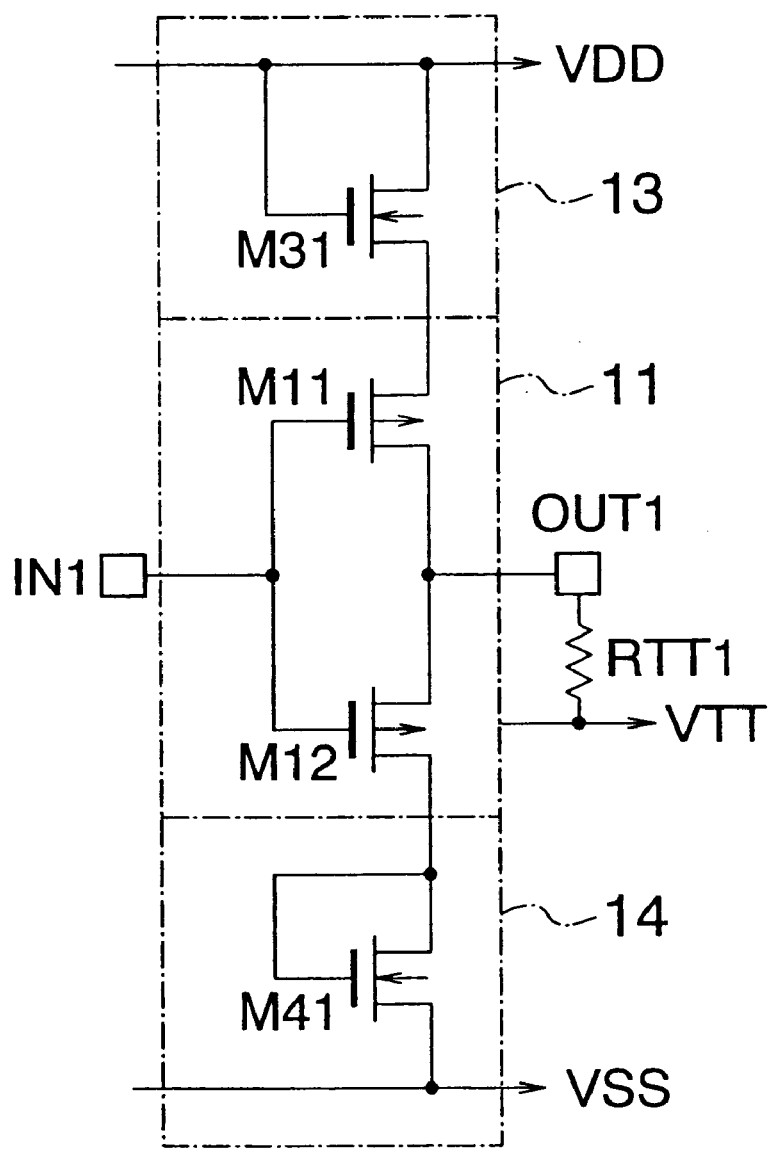
FIG. 5 is a circuit diagram of an output circuit according to a third embodiment of the present invention.

Referring to FIG. 5, an output circuit according to a third embodiment of the present invention comprises the constituent elements of both the first embodiment and the second embodiment. Specifically, the output circuit of the present embodiment comprises a voltage control section 13 having an output section 11 including pMOS transistors M11 and M12 connected in series, and a voltage control section 13 having a nMOS transistor M31 connected between power source line VDD and output section 11, and a voltage control section 14 having a nMOS transistor M41 connected between source line VSS and output section 11.

In operation, the output circuit of the present embodiment suppresses variations in both H-level voltage VOH and L-level voltage VOL of the output signal. Specifically, when a signal potential at L-level which is close to the potential of power source voltage VSS is supplied to input terminal IN, similarly to the first embodiment, the variation of H-level VOH of the output signal is suppressed. In addition, when a signal potential at H-level which is close to the potential of power source voltage VDD is supplied to input terminal IN, similarly to the second embodiment, the variation of L-level VOL of the output signal is suppressed.

The variation of output signal of the present embodiment is compared against the variation of output signal of the first conventional output circuit. The variation of H-level VOH of the present embodiment by the influence of the three factors is similar to that in the first embodiment and the variation of L-level VOL is similar to that in the second embodiment. The signal amplitude VOHC−VOLC is calculated taking into account the variation factors as follows:

$$VOHC-VOLC=0.500V \text{ to } 0.765V \quad (15).$$

Thus, the variation of the signal amplitude VOH−VOL of the present embodiment resides −16.7% to +26.0% from a normal voltage of 0.6V wherein the three factors are not taken into account, which fact shows a significant improvement from the conventional variation range of −29.0% to +69.0%.

In the above embodiments, voltage control section is implemented by a diode formed by connecting the gate and the drain of NMOS/PMOS transistor. It is also possible to implement the voltage control section by a diode formed by connecting the base and the collector of NPN/PNP bipolar transistor.

In addition, the voltage control section may be replaced by a power source circuit which is generally used inside the integrated circuit or outside the integrated circuit for supplying more accurate and stable potential.

In the above embodiments, gate-source voltage of a nMOS/pMOS transistor forming a diode structure or diode connection is used in the voltage control section. Base-emitter voltage of nMOS/pMOS transistor forming a diode connection may also be used instead. The gate-source voltage or the base-emitter voltage, however, varies with the temperature change. Generally, higher temperature results in a lower gate-source voltage or lower base-collector voltage. That is, L-level VOH and H-level VOL of output signals vary according to expressions (9) and (12). A fourth embodiment of the present invention described hereinafter can be used to suppress the voltage change caused by a temperature fluctuation.

Figure 6:
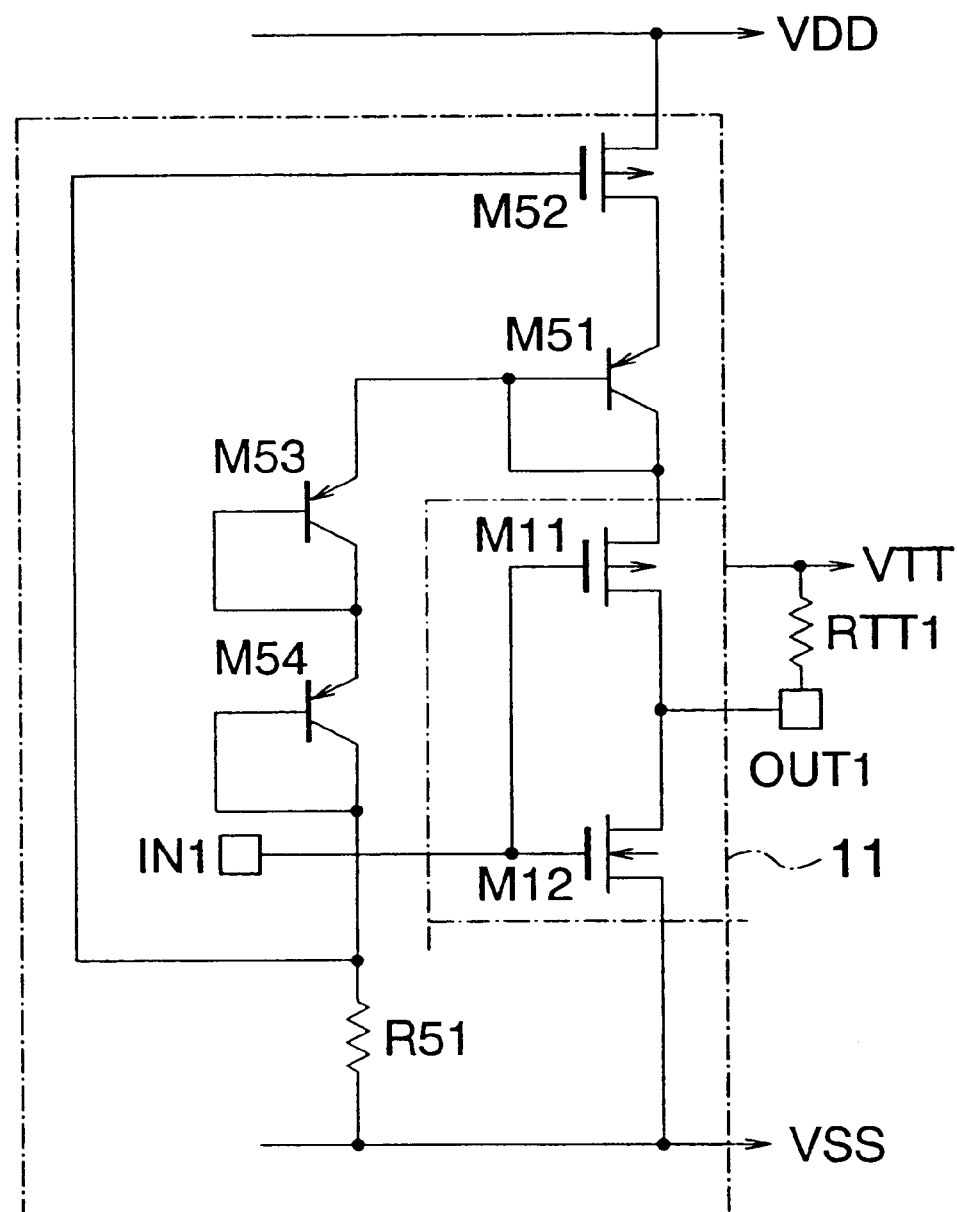
FIG. 6 is a circuit diagram of an output circuit according to a fourth embodiment of the present invention.

Referring to FIG. 6, the output circuit according to the present embodiment is similar to the first embodiment except that a voltage control section 15 is provided in the present embodiment instead of voltage control section 13 of the first embodiment.

Voltage control section 15 comprises: a PNP transistor M51 having a collector and a base connected together to the source of transistor M11 in output section 11; a PMOS transistor M52 having a drain connected to the emitter of transistor M51 and a source connected to power source line VDD; a PNP transistor M53 having an emitter connected to the collector of transistor M51 and a collector and a base connected together; a PNP transistor M54 having an emitter connected to the collector of transistor M53 and a collector and a base connected together; and a resistor R51 having a first terminal connected to the collector of transistor M54 and to the gate of transistor M52 and a second terminal connected to power source line VSS.

In operation, the output circuit 15 functions for suppressing the variation of H-level VOH of output signals, similarly to the first embodiment. Specifically, smaller ON-resistance RONN of transistor M11 of output circuit 11 reduces the absolute variations in ON-resistance RONN caused by the influence of the three factors, thereby suppressing the variation of H-level VOH of output signals.

Assuming that a signal potential at L-level which is close to the potential of power source voltage VSS is supplied to input terminal IN, tansistors M11 and M12 of output circuit 11 are ON and OFF, respectively, whereas transistors M51 and M52 of voltage control section 15 are ON at any time.

Thus, a current path is formed from power source VDD via transistors M51 and M52, transistor M11 and terminal resistor RTT1 to terminal power source VTT. H-level VOH of the output terminal at this stage is expressed by:

$$VOH = VTT + \{(VDD - VBP51 - VTT) \times RTT\}/ \qquad (16)$$
$$(RTT + RONP11 + RONP52) = VTT + VRTTP.$$

Accordingly, voltage drop VRTTP at terminal resistor RTT is expressed by:

$$VRTTP = \{(VDD-VBP51-VTT) \times RTT\}/RTT+RON\ P11+ RONP52) \qquad (17)$$

wherein VBP51 represents a base-emitter voltage of PNP transistor M51, and RONP11 and RONP52 represent the gate-source voltages of PMOS transistors M11 and M52, respectively.

ON-resistance of transistor M51 is neglected because it is significantly smaller compared to the other resistances.

It is possible to eliminate the temperature drift of H-level VOH of the output signal in expression (16) by differentiating expression (16) with respect to temperature "T", followed by solving the equation dVOH/dT=0.

Specifically, the temperature drift of expression (16) is calculated as follows:

$$dVOH/dT = (dVBP51/dT) \times (RONP52^2 \times \alpha \times VRTTP-RTT)/(RTT+RONP11+RONP52) \qquad (18),$$

wherein dVBP51/dT represents the temperature drift of a base-emitter voltage VBP51 of transistor M51, and "α" represents the number of transistors each having a diode connection and connected between the drain of PMOS transistor M52 and resistor R51, that is "3", as obtained by counting the number of transistors M51, M53 and M54 in this case.

By letting expression (18) to be "0", it is possible to solve the equation;

$$RONP52^2 \times \alpha \times VRTTP-RTT=0 \qquad (19).$$

If each variable in expression (19) is set such that α=3, VRTTP=0.3V and RTT=50 Ω. RONP52 is obtained as follows:

$$RONP52=7.5\ \Omega \qquad (20).$$

Namely, if ON-resistance of PMOS transistor M52 assumes or approximately equal to the value defined in expression (20), the temperature drift of H-level VOH of the output signal can be deleted or suppressed. ON-resistance of transistor M52 can be selected at a desired value by adjusting the shape of the transistor.

Although "α" in expression (19) is set at "3" corresponding to three transistors M51, M53 and M54 in the present embodiment, the value for α is arbitrarily selected by selecting the number of transistors based on the source voltage VDD. For instance, if source voltage VDD is 3V, "α" may be set between 1 and 4.

Figure 7:
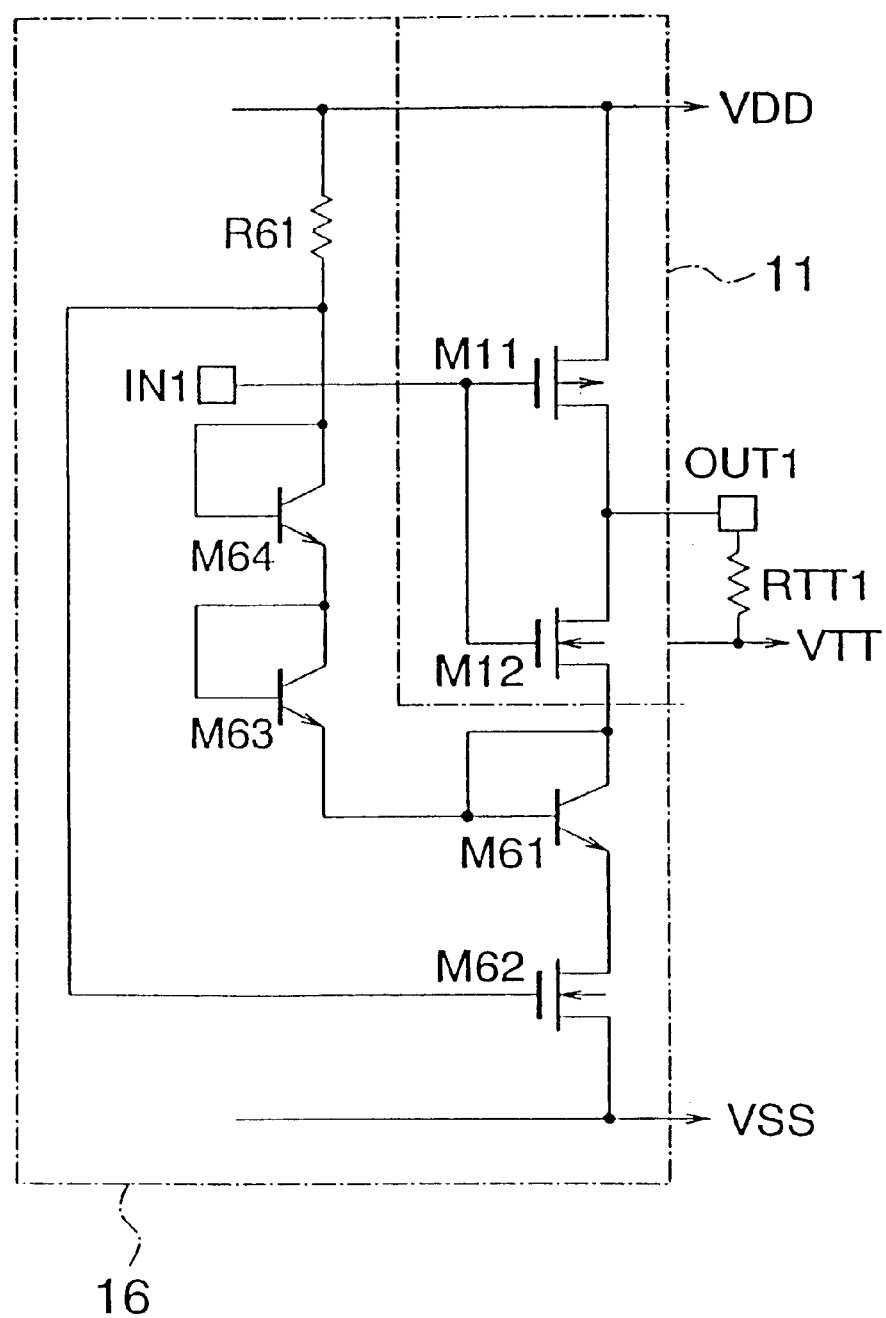
FIG. 7 is a circuit diagram of an output circuit according to a fifth embodiment of the present invention.

Referring to FIG. 7, an output circuit according to a fifth embodiment of the present invention is similar to the fourth embodiment except that a voltage control section 16 connected between power source line VSS and the source of transistor M12 for controlling the source voltage of transistor M12 has a temperature compensation function.

Voltage control section 16 comprises an NPN transistor M61 having a collector and a base connected together to the source of transistor M12 in output section 11; an NMOS transistor M62 having a drain connected to the emitter of transistor M61 and a source connected to power source line VSS; an NPN transistor M63 having an emitter connected to the collector of transistor M61 and a collector and a base connected together; an NPN transistor M64 having an emitter connected to the collector of transistor M63 and a collector and a base connected together; and a resistor R61 having a first terminal connected to the collector of transistor M64 and to gate of transistor M62 and a second terminal connected to power source line VDD.

In operation, the output circuit has a function for suppressing variation of L-level VOL of output signals. Specifically, a smaller ON-resistance RONN of transistor M12 of output circuit 11 reduces absolute variations in ON-resistance RONN caused by the influence of the three factors, to suppress the variation of L-level VOL of output signals.

Assuming that a signal potential at H-level which is close to the potential of power source voltage VDD is supplied to input terminal IN, transistors M12 and M11 of output circuit 11 are ON and OFF, respectively, whereas transistors M61 and M62 of voltage control section 16 are ON at any time. Thus, a current path is formed from terminal power source VTT via terminal resistor RTT1, transistors M12 and M61 and transistor M62 to source line VSS. L-level VOL of the output terminal at this stage is expressed by:

$$VOL = VTT - \{(VTT - VBN61 - VSS) \times RTT\}/ \qquad (21)$$
$$(RTT + RONN12 + RONN62) = VTT + VRTTN.$$

Voltage drop VRTTN across terminal resistor RTT is expressed by:

$$VRTTN=\{(VTT-VBP61-VSS) \times RTT\}/(RTT+RONN12+RONN62) \qquad (22),$$

wherein VBP61 represents base-emitter voltage of NPN transistor M61, and RONN12 and RONN62 represent gate-source voltages of NMOS transistors M12 and M62, respectively. ON-resistance of transistor M61 is neglected because it is small.

As in the case of the fourth embodiment, the expression (21) is differentiated with respect to temperature "T" as follows:

$$dVOL/dT = (dVBN61/dT) \times (RONN62^2 \times \alpha \times VRTTN-RTT)/(RTT+RONN12+RONN62) \qquad (23),$$

wherein DVBN61/dT represents the temperature drift of a base-emitter voltage VBN61 of transistor M61, and "α" represents the number of tansistors each having a diode connection and connected between the drain of NMOS transistor M62 and resistor R61, that is, "3" as obtained from the number of transistors M61, M63 and M64 in this case. Let dVOL/dT=0 to eliminate the temperature drift of output L-level VOL;

$$RONN62^2 \times \alpha \times VRTTN-RTT=0 \qquad (24).$$

If each variable in expression (24) is set such that α=3, VRTTN=0.3V and RTT=50 Ω. RONN62 is obtained as follows:

$$RONN62=7.5\ \Omega \qquad (25).$$

Namely, if ON-resistance RONN62 of NMOS transistor M62 assumes or is approximately equal to the value defined by expression (25), the temperature drift of L-level VOL of the output signal can be deleted or suppressed.

ON-resistance of transistor M62 can be selected by adjusting the shape of the transistor similarly to the fourth embodiment.

It will be understood that it is possible to combine the fourth and the fifth embodiments to obtain an output circuit having functions of compensating temperature variations and suppressing the variation of H-level VOH and L-level VOL of output signals, similarly to the third embodiment.

Figure 8:
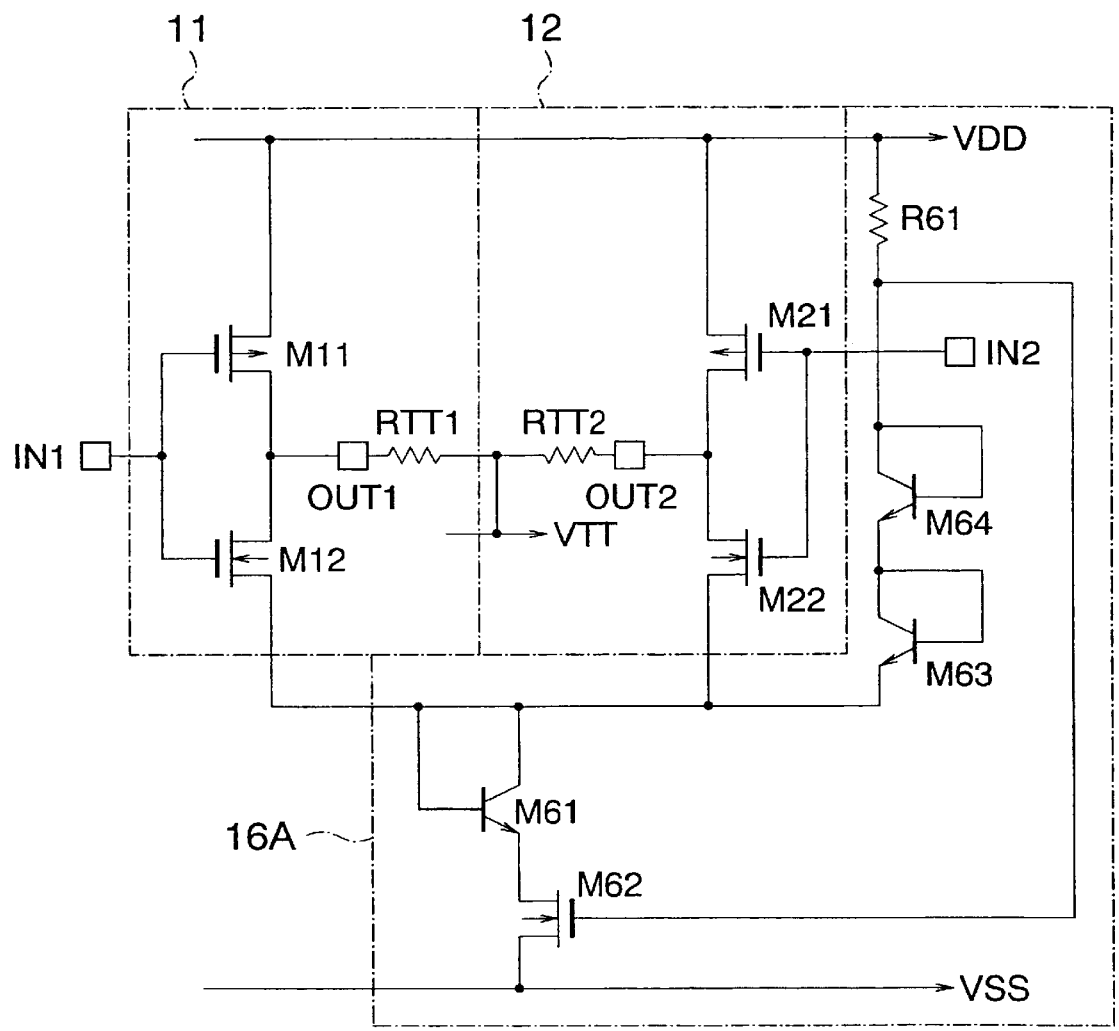
FIG. 8 is a circuit diagram of an output circuit according to a sixth embodiment of the present invention.

Referring to FIG. 8, an output circuit according to a sixth embodiment of the present invention is implemented as a differential transmission system. The output circuit of the present embodiment comprises a first and second output sections 11 and 12 which are similar to those in the second conventional output circuit, and a voltage control section 16A similar to that in the fifth embodiment.

Voltage control section 16A comprises an NPN transistor M61 having a collector and a base connected together to a node connecting together the sources of transistors M12 and M22 in output sections 11 and 12; an NMOS transistor M62 having a drain connected to the emitter of transistor M61 and a source connected to power source line VSS; an NPN transistor M63 having an emitter connected to the collector of transistor M61 and a collector and a base connected together; an NPN transistor M64 having an emitter connected to the collector of transistor M63 and a collector and a base connected together; and a resistor R61 having a first terminal connected to the collector of transistor M64 and to gate of transistor M62 and a second terminal connected to power source line VDD.

Since the present embodiment is directed to the differential transmission system, there exist two input terminals 1N1 and IN2 and two output terminals OUT1 and OUT2. However, it will be understood that the output section 11 and the voltage control section 16A are similar to those in the fifth embodiment directed to a single phase transmission system. The same applies to output section 12.

Output sections 11 and 12 and voltage control section 16A of the present embodiment operate similarly to those in the fifth embodiment. Accordingly, descriptions of the operation is omitted herein for avoidance of duplication.

In the present embodiment, a single voltage control section 16A is provided for the pair of output sections 11 and 12. A pair of voltage control sections 16A may be provided, although the operation and the advantages are little improved from the single voltage control section.

In the above embodiments, the first to fifth embodiments are directed to the single phase transmission system, whereas the sixth embodiment is directed to the differential transmission system. However, the first to fourth embodiments may be applied to the differential motion transmission system.

Since the above embodiments are described only for examples, the present invention is not limited to the above embodiments and various modifications or alterations can be easily made therefrom by those skilled in the art without departing from the scope of the present invention.

What is claimed is:

1. A small amplitude signal output circuit comprising:

a first output section having a first transistor of a first conductivity type and a second transistor of a second conductivity type connected in series between a first source line and a second source line, said first output section receiving a first logic signal to output a first output signal through a first node connecting said first transistor and said second transistor; and a first voltage control section connected between said first source line and said first transistor for reducing a supply voltage for said output section;

wherein said voltage control section comprises a third transistor and a first diode connected in series between said first source line and said first transistor, and at least one second diode and a resistor connected in series between said first diode and said second source line, and wherein a second node connecting said at least one second diode and said resistor is connected to a control electrode of said third transistor.

2. A small amplitude signal output circuit as defined in claim 1, further comprising a second voltage control section connected between said second transistor and said second source line for reducing the supply voltage for said output section.

3. A small amplitude signal output circuit as defined in claim 1, wherein said first node is connected to a terminal source line through a terminal resistor.

4. A small amplitude signal output circuit comprising:

a first output section having a first transistor of a first conductivity type and a second transistor of a second conductivity type connected in series between a first source line and a second source line, said first output section receiving a first logic signal to output a first output signal through a first node connecting said first transistor and said second transistor; and a first voltage control section connected between said first source line and said first transistor for reducing a supply voltage for said first output section;

a second output section having a third transistor and a fourth transistor connected in series between said voltage control section and said second source line, said second output section receiving a second logic signal to output a second output signal through a second node connecting said third transistor and said fourth transistor;

wherein said voltage control section comprises a fifth transistor and a first diode connected in series between said first source line and said first transistor, and at least one second diode and a resistor connected in series between said first diode and said second source line, and wherein a third node connecting said at least one second diode and said resistor is connected to a control electrode of said fifth transistor.

\* \* \* \* \*